United States Patent
Hsu et al.

(10) Patent No.: US 10,026,729 B2
(45) Date of Patent: Jul. 17, 2018

(54) SURGE-PROTECTION CIRCUIT AND SURGE-PROTECTION METHOD

(71) Applicant: MediaTek Inc., Hsin-Chu (TW)

(72) Inventors: Sheng-Fu Hsu, Hsinchu (TW); Je-Shen Hu, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 666 days.

(21) Appl. No.: 14/582,650

(22) Filed: Dec. 24, 2014

(65) Prior Publication Data

US 2015/0262994 A1    Sep. 17, 2015

Related U.S. Application Data

(60) Provisional application No. 61/951,701, filed on Mar. 12, 2014.

(51) Int. Cl.
*H02H 9/02* (2006.01)
*H01L 27/02* (2006.01)

(52) U.S. Cl.
CPC ...... *H01L 27/0285* (2013.01); *H01L 27/0248* (2013.01); *H01L 27/0262* (2013.01)

(58) Field of Classification Search
USPC .......................................................... 361/56
See application file for complete search history.

(56) References Cited

U.S. PATENT DOCUMENTS

| 5,615,225 A * | 3/1997 | Foster ..................... H04M 3/26 370/241 |
| 7,184,253 B1 * | 2/2007 | Hartranft ............ H01L 27/0266 361/111 |
| 7,671,416 B1 | 3/2010 | O et al. |
| 8,711,533 B2 | 4/2014 | Tatsumi |
| 2002/0071230 A1 * | 6/2002 | Colclaser ............ H01L 27/0266 361/56 |
| 2003/0020544 A1 * | 1/2003 | Behzad ............... H01F 17/0006 330/254 |
| 2003/0043523 A1 | 3/2003 | Hung et al. |
| 2005/0040846 A1 * | 2/2005 | Otsuka .................... H04L 25/08 326/31 |
| 2006/0119998 A1 | 6/2006 | Yang et al. |

(Continued)

FOREIGN PATENT DOCUMENTS

CN    102810538 A    12/2012
CN    102820292 A    12/2012

(Continued)

*Primary Examiner* — Ronald W Leja
(74) *Attorney, Agent, or Firm* — Wolf, Greenfield & Sacks, P.C.

(57) ABSTRACT

A surge-protection circuit for a chip is provided. The surge-protection circuit includes a detection element and a protection element. The detection element is embedded on the chip and arranged between a first terminal and a second terminal, and the detection element is utilized to detect whether an abrupt voltage variation occurs due to a surge or not and generate an enabling signal when the abrupt voltage variation occurs. The protection element is embedded on the chip and coupled to the detection element, and the protection element is utilized to adjust and reduce the abrupt voltage variation through bypassing high energy generated by the surge after receiving the enabling signal.

18 Claims, 8 Drawing Sheets

(56) References Cited

U.S. PATENT DOCUMENTS

| | | | |
|---|---|---|---|
| 2006/0193310 A1* | 8/2006 | Landry | H04M 11/062 370/356 |
| 2007/0205465 A1 | 9/2007 | Yabu et al. | |
| 2008/0019501 A1* | 1/2008 | Miller, III | H04L 12/40032 379/412 |
| 2009/0128161 A1* | 5/2009 | Xu | G06F 11/24 324/539 |
| 2009/0135534 A1* | 5/2009 | Ishii | H01L 27/0251 361/56 |
| 2009/0244800 A1* | 10/2009 | Wedley | H04M 19/005 361/119 |
| 2009/0268359 A1 | 10/2009 | Chatty et al. | |
| 2010/0103572 A1* | 4/2010 | Worley | H01L 27/0255 361/56 |
| 2012/0099229 A1* | 4/2012 | Domanski | H01L 27/0262 361/56 |
| 2012/0236447 A1 | 9/2012 | Mack et al. | |
| 2012/0307406 A1 | 12/2012 | Tatsumi | |
| 2012/0307410 A1 | 12/2012 | Yamazaki et al. | |
| 2014/0098447 A1* | 4/2014 | Srivastava | H02H 9/046 361/56 |
| 2015/0162901 A1* | 6/2015 | Lu | H03K 5/08 327/328 |
| 2015/0262994 A1* | 9/2015 | Hsu | H01L 27/0248 361/56 |
| 2016/0072441 A1* | 3/2016 | Lakdawala | H04B 1/0053 455/78 |
| 2017/0070199 A1* | 3/2017 | Anderson | B82Y 10/00 |
| 2017/0222431 A1* | 8/2017 | Welty | H02H 9/002 |

FOREIGN PATENT DOCUMENTS

| | | |
|---|---|---|
| JP | 2000139026 | 5/2000 |
| JP | 2007234987 | 9/2007 |
| WO | WO 2009/050641 | 4/2009 |

* cited by examiner

SURGE-PROTECTION CIRCUIT AND SURGE-PROTECTION METHOD

CROSS REFERENCE TO RELATED APPLICATIONS

This application claims the benefit of U.S. Provisional Application No. 61/951,701, filed on Mar. 12, 2014, the entirety of which is/are incorporated by reference herein.

BACKGROUND OF THE INVENTION

Field of the Invention

The present invention relates to a surge-protection circuit, and in particular to an on-chip surge-protection circuit and an on-chip surge protection method.

Description of the Related Art

Damage caused by surge or electrostatic discharge (ESD) has become one of the main reliability concerns with integrated circuits (IC) products. FIG. 1 is a schematic diagram of a conventional digital subscriber loop system 100. The digital subscriber loop system 100 includes a primary surge protection component 110, a transformer 120, a secondary surge-protection component 130, a loop component 150 and logic components 160A and 160B. Nodes TXN, TXP, RXP and RXN are the IC pins. When surge occurs near the loop component 150, the primary surge-protection component 110 and the secondary surge-protection component 130 will release the abrupt discharging and protect the digital subscriber loop system 100 and the IC.

However, the primary surge-protection component 110, the secondary surge-protection component 130 and/or other protection components (such as Zener diodes or a Thyristor Surge Suppresser) are equipped on the system board of the digital subscriber loop system 100, costing more and taking up space. Therefore, an on-chip surge-protection circuit embedded within the IC is needed to reduce cost and also to simplify the structure of the digital subscriber loop system 100.

BRIEF SUMMARY OF THE INVENTION

The present invention provides a surge-protection circuit for a chip to detect the surge or an ESD event and develop a discharge path to alleviate the abrupt high energy and protect the IC. By utilizing the surge-protection circuit of the present invention, the IC and the system can be protected at a lower cost and have a simplified structure and reduced system size, while the additional and dedicated protection components mentioned in the related art may be eliminated.

The present invention provides a surge-protection circuit for a chip. The surge-protection circuit includes a detection element and a protection element. The detection element is embedded on the chip and is arranged between a first terminal and a second terminal, and the detection element is utilized to detect whether or not an abrupt voltage variation occurs due to a surge and to generate an enabling signal when the abrupt voltage variation occurs. The protection element is embedded on the chip and coupled to the detection element, utilized to adjust and reduce the abrupt voltage variation by bypassing high energy generated by the surge after receiving the enabling signal. In one embodiment, the first terminal and the second terminal are transmission outputs of the chip. In another embodiment, the first terminal and the second terminal are a receiving input and a ground of the chip.

The present invention provides a surge-protection circuit. The surge-protection circuit includes a differential pair and an N-type transistor. The differential pair is composed of two P-type transistors and is embedded on the chip. The sources of the two P-type transistors are coupled to a first terminal and a second terminal respectively, the drains of the two P-type transistors are coupled together, and the gates of the two P-type transistors are biased to a pre-determined voltage, and when an abrupt voltage variation occurs, a voltage of one of the sources exceeds the pre-determined voltage and an enabling signal is generated at the drains of the two P-type transistors. The N-type transistor is embedded on the chip and coupled to the drains of the two P-type transistors. A drain and a source of the N-type transistor are coupled to the first terminal and the second terminal, and after receiving the enabling signal the N-type transistor is turned on for bypassing the high energy of the surge from the first terminal or the second terminal.

In one embodiment of the present invention, portions of the sources of the two P-type transistors and/or the drain and the source of the N-type transistor are lacking in silicide to increase the resistance. In another embodiment of the present invention, a BIAS element is coupled to the differential pair for biasing the pre-determined voltage at the gates of the two P-type transistors. In addition, a buffer is coupled to the drains of the two P-type transistors to drive the N-type transistor.

The present invention provides a surge-protection method utilized for a surge-protection circuit which is embedded on a chip and arranged between a first terminal and a second terminal. The surge-protection method includes detecting whether an abrupt voltage variation occurs due to a surge or not by a detection element of the surge-protection circuit; generating an enabling signal by the detection element when the abrupt voltage variation occurs; and reducing the abrupt voltage variation through bypassing high energy generated by the surge after receiving the enabling signal by a protection element of the surge-protection circuit.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF THE INVENTION

The following description is of the best-contemplated operation of carrying out the invention. This description is made for the purpose of illustrating the general principles of the invention and should not be taken in a limiting sense. Certain terms and figures are used throughout the description and following claims to refer to particular components. As one skilled in the art will appreciate, manufacturers may refer to a component by different names. This document does not intend to distinguish between components that differ in name but not function. The terms "component", "system" and "device" used in the present invention could be the entity relating to the computer which is hardware, software, or a combination of hardware and software. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
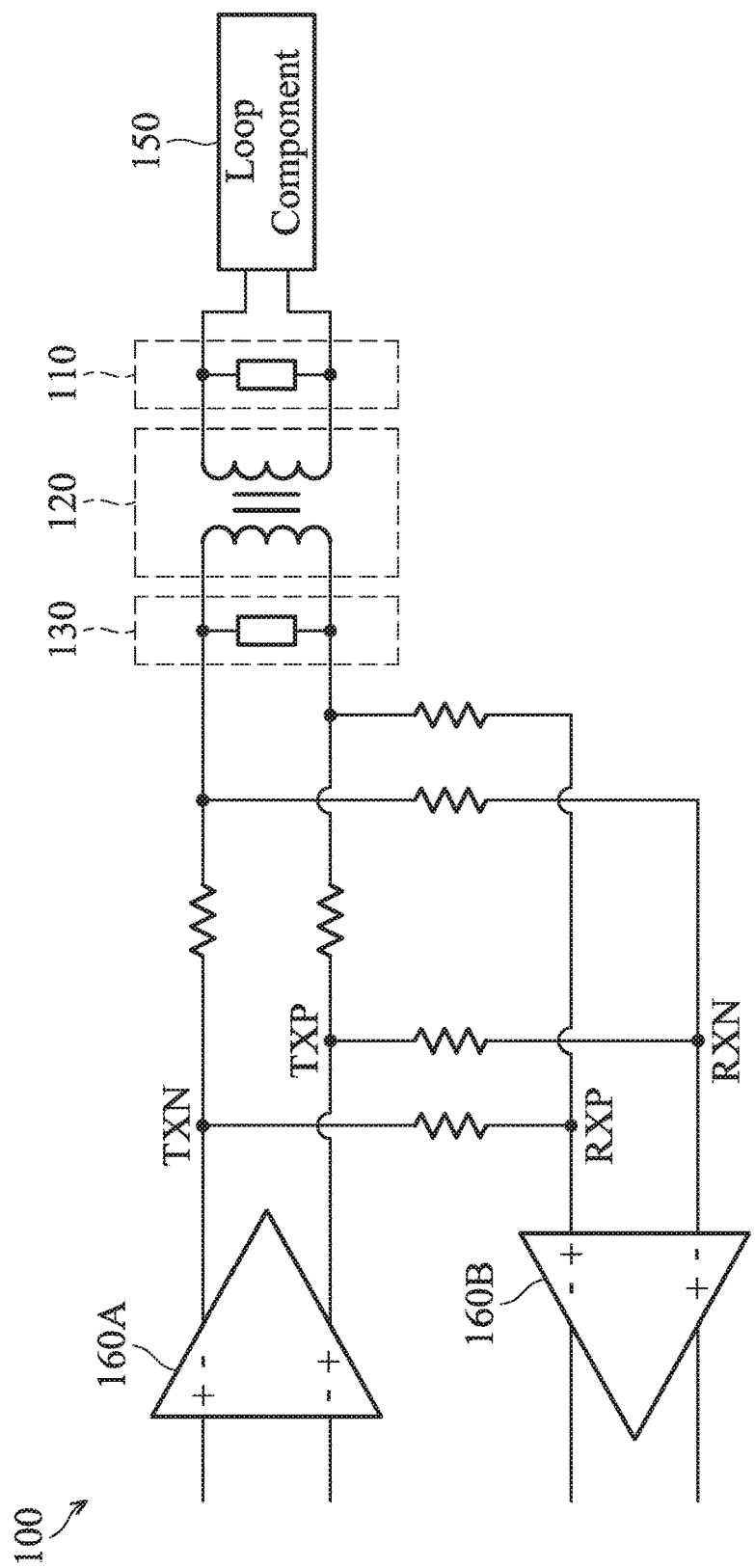
FIG. 1 is a schematic diagram of the conventional digital subscriber loop system.
Figure 2:
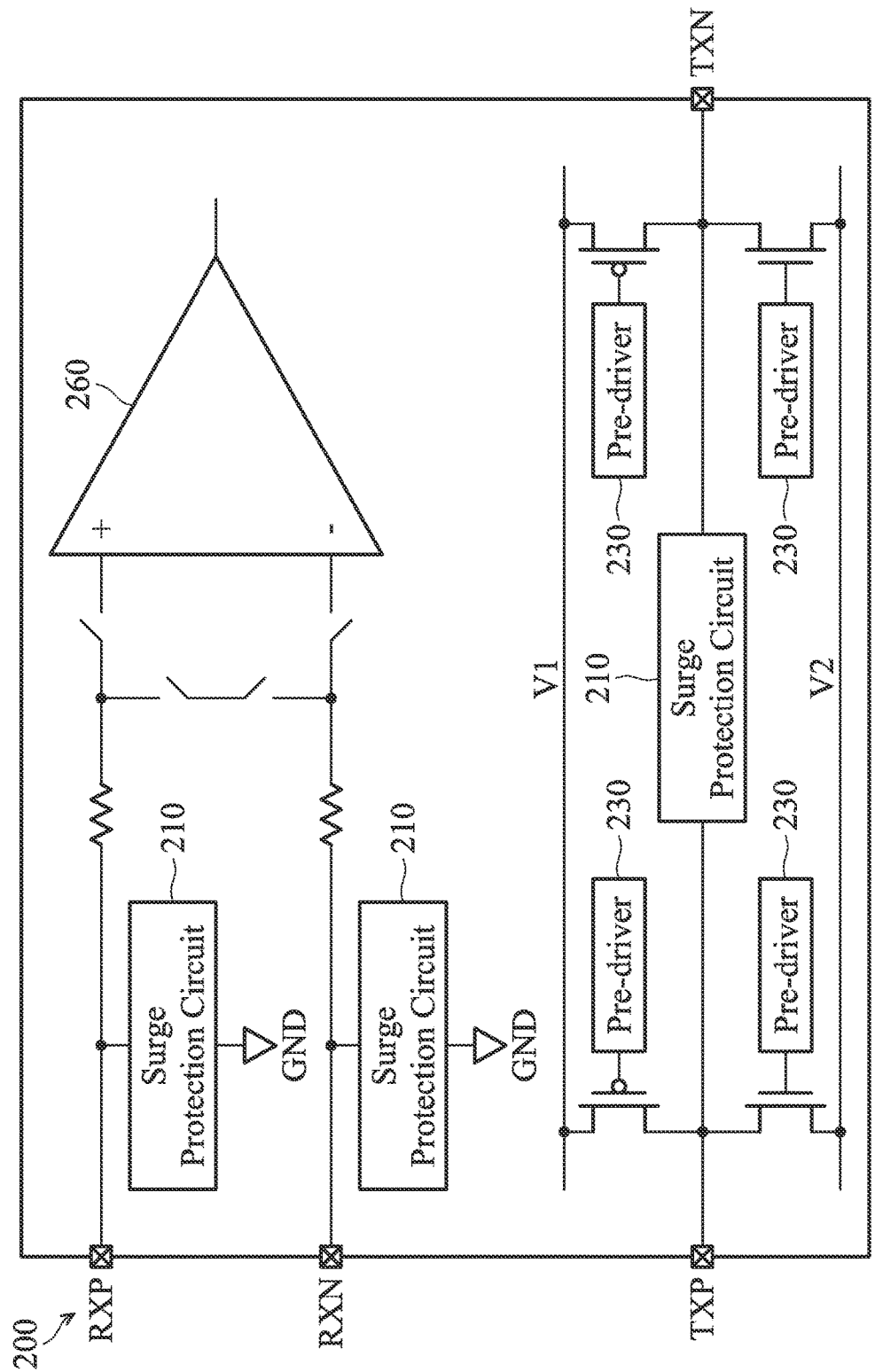
FIG. 2 is a schematic diagram of the chip of the digital subscriber loop system according to one embodiment of the present invention.

FIG. 2 is a schematic diagram of the chip 200 of the digital subscriber loop system according to one embodiment of the present invention. The chip 200 (or IC) includes at least one surge-protection circuit 210, pre-drivers 230, a logic component 260, two voltage sources V1 and V2, four nodes TXN, TXP, RXP and RXN, and some transistors and resistors. Specifically, the surge-protection circuit 210 and the pre-drivers 230 are biased by the voltage sources V1 and V2, and the nodes TXN, TXP, RXP and RXN are the IC pins. For example, nodes TXN, TXP are transmission outputs of the chip, and the nodes RXP and RXN are receiving inputs of the chip. In one embodiment, the node TXP is the transceiver differential positive output, the node TXN is the transceiver differential negative output, the node RXP is the receiver differential positive input, the node RXN is the receiver differential negative input.

However, it should be noted that the surge-protection circuit 210 can improve the surge-protection performance of both the differential mode and the common mode. Since the surge-protection circuit 210 is embedded on the chip 200 to reduce the cost of the surge-protection components outside the chip 200, it can be arranged between the first terminal and the second terminal which belong to any two nodes within the chip 200. For example, as shown in FIG. 2, the surge-protection circuit 210 is arranged or located between the node TXP (the first terminal) and the node TXN (the second terminal). In one embodiment, the surge-protection circuit 210 is arranged between the node RXN (the first terminal) and the ground GND (the second terminal). In another embodiment, the surge-protection circuit 210 is arranged between the node RXP (the first terminal) and the ground GND (the second terminal). The above implementation is for illustration and is not intended to be limiting. For example, the surge-protection circuit 210 can also be arranged between the node RXP and the input terminal of the logic component 260. In another example, the surge-protection circuit 210 can also be arranged between the node TXP and the pre-driver 230.

Figure 3A:
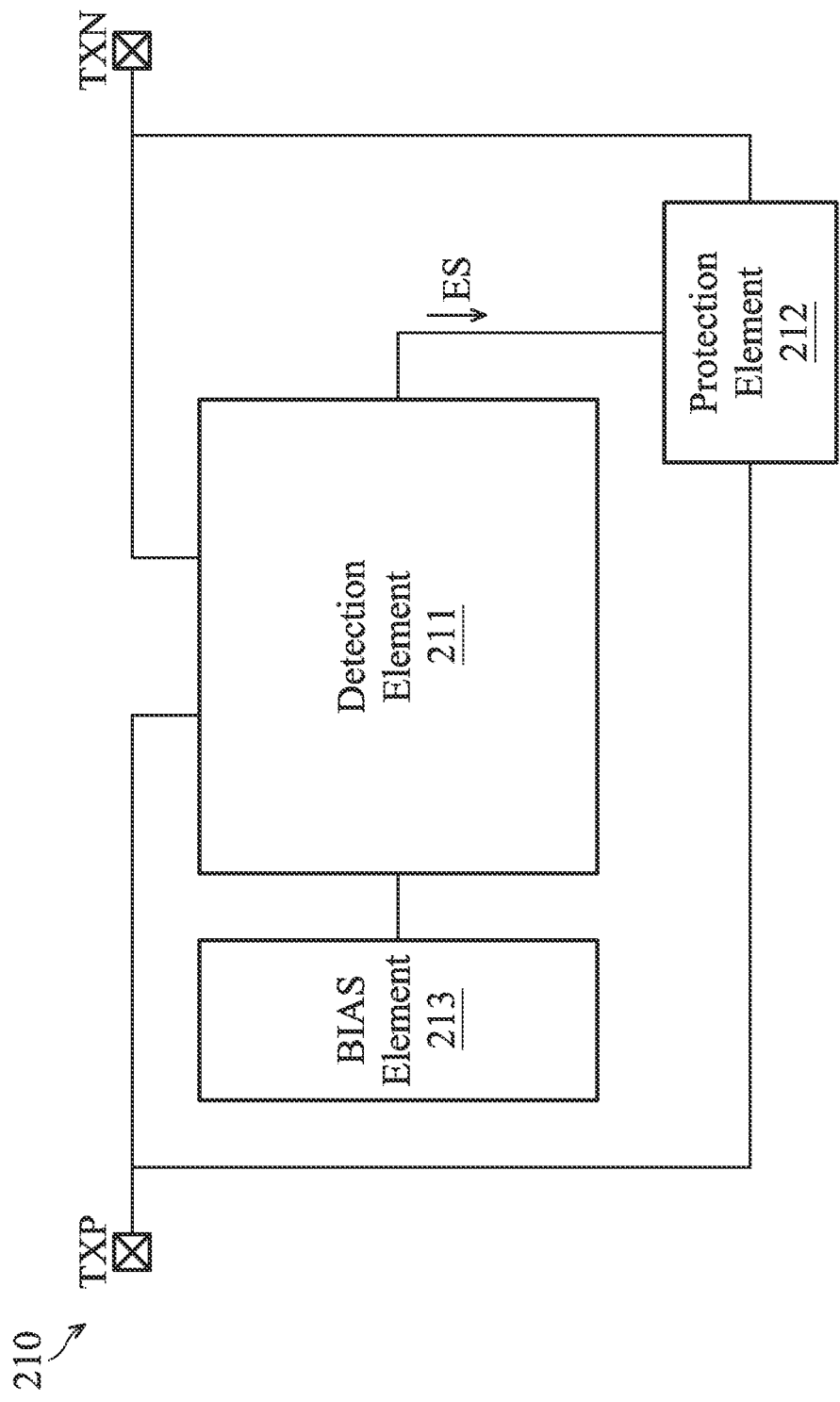
FIG. 3A is a schematic diagram of the surge-protection circuit of the chip according to one embodiment of the present invention.

FIG. 3A is a schematic diagram of the surge-protection circuit 210 of the chip 200 according to one embodiment of the present invention. The surge-protection circuit 210 includes the detection element 211, the protection element 212 and the BIAS element 213. In one embodiment, the detection element 211 is embedded on the chip 200 and arranged between a first terminal (i.e., the node TXP) and a second terminal (i.e., the node TXN). The detection element 211 is utilized to detect whether an abrupt voltage variation occurs due to a surge or not and generate an enabling signal ES when the abrupt voltage variation occurs. When the surge occurs, it will discharge a lot and generate high energy which results in the abrupt voltage variation and/or the abrupt current variation, which mean that the voltage and/or current change rapidly and severely. Therefore, the detection element 211 is utilized to detect the above violent changes caused by the surge or the surge discharge.

In one embodiment, the protection element 212 is embedded on the chip 200 and coupled to the detection element 211. Specifically, the protection element 212 is utilized to adjust and reduce the abrupt voltage variation by bypassing the high energy generated by the surge after receiving the enabling signal ES. For example, the protection element 212 can be a silicon control rectifier (SCR) or a field oxide device (FOD). The trigger terminal of the protection element 212 is connected to the detection element 211, and an anode and a cathode of the protection element 212 are respectively connected to the first terminal and the second terminal for bypassing the high energy of the surge from the first terminal or the second terminal. In addition, The BIAS element 213 is coupled to the detection element 211 for biasing the pre-determined voltage of the detection element 211.

Figure 3B:
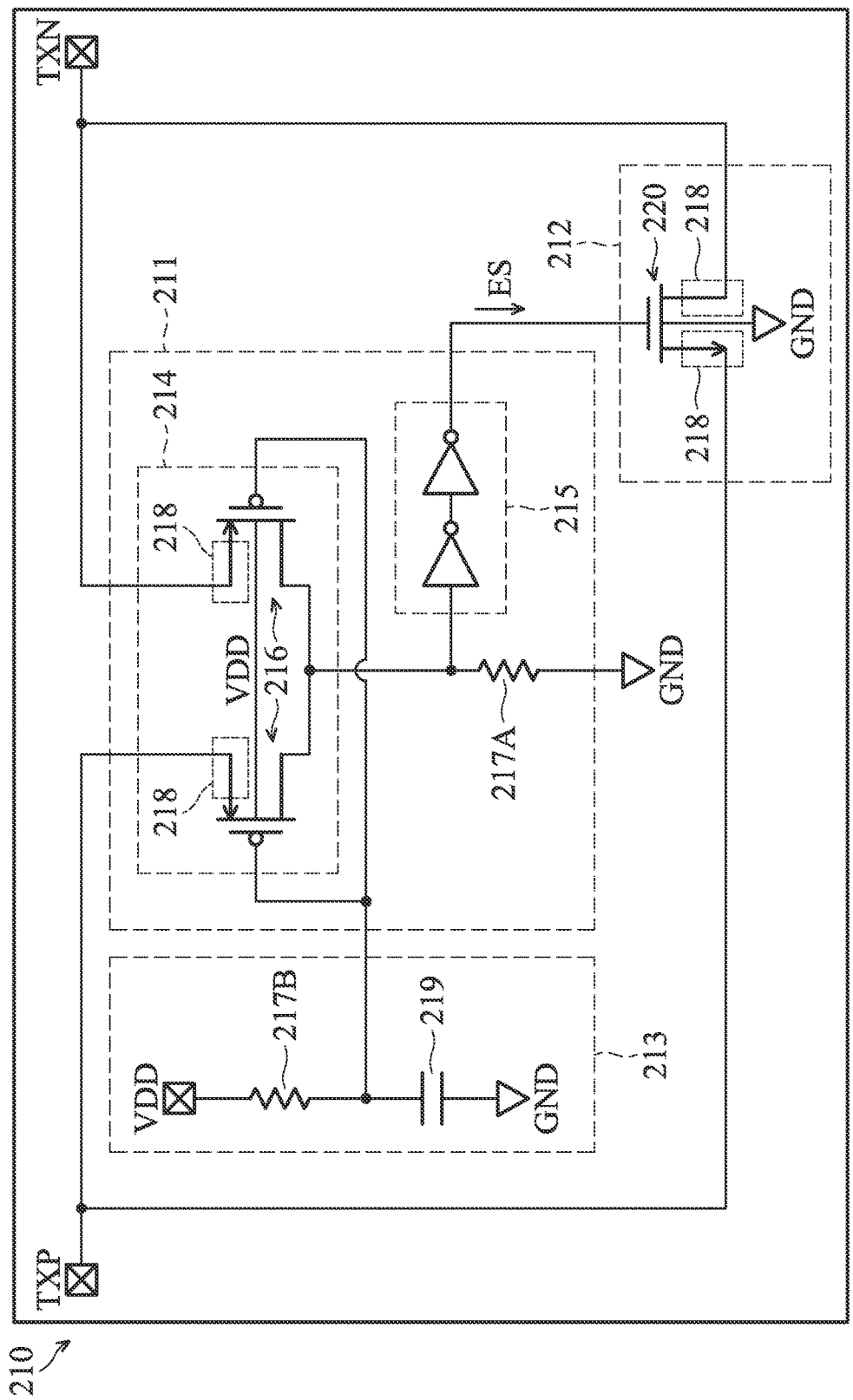
FIG. 3B is a schematic diagram of the surge-protection circuit of the chip according to another embodiment of the present invention.

FIG. 3B is a schematic diagram of the surge-protection circuit 210 of the chip 200 according to another embodiment of the present invention. In one embodiment, the detection element 211 includes a differential pair 214 composed of two P-type transistors 216, for example, two P-type metal-oxide-semiconductor (PMOS) transistors. The sources of the two P-type transistors 216 are connected to the first terminal (the node TXP) and the second terminal (the node TXN) respectively, and the drains of the two P-type transistors 216 are connected together, and the gates of the two P-type transistors 216 are biased to a pre-determined voltage VDD. It should be noted that the detection element 211 is implemented by, but not limited to the P-type transistors 216. In other words, the differential pair 214 of two N-type transistors, for example, two N-type metal-oxide-semiconductor (NMOS) transistors, can also be utilized in the detection element 211.

It should be noted that in one embodiment, when the abrupt voltage variation occurs, a voltage of one of the sources of the P-type transistors 216 exceeds the pre-determined voltage VDD and the enabling signal ES is generated at the drains of the two P-type transistors 216. The enabling signal ES is utilized to initiate or turn on the protection element 212. Furthermore, the detection element 211 also includes the buffer 215 and the resistor 217A. The buffer 215 is coupled between the gate of the N-type transistor 220 and the drains of the two P-type transistors 216 to drive the protection element 212. For example, the buffer 215 includes at least one inverter and/or other logic components. The resistor 217A is arranged between the ground GND and the drains of the two P-type transistors 216.

In one embodiment, as shown in FIG. 3B, the protection element 212 includes an N-type transistor 220. The gate of the N-type transistor 220 of the protection element 212 is coupled to the drains of the two P-type transistors 216, a drain and a source of the N-type transistor 220 are connected to the first terminal and the second terminal. In another embodiment, the buffer 215 is coupled between the gate of the N-type transistor 220 and the drains of the P-type transistors 216. After receiving the enabling signal from the detection unit 211, the N-type transistor 220 of the protection element 212 is turned on for bypassing the high energy of the surge from the first terminal or the second terminal. In addition, the BIAS element 213 is coupled to the detection element 211 for biasing the pre-determined voltage VDD at the gates of the two P-type transistors 216. The BIAS element 213 includes the voltage source of the pre-determined voltage VDD, the resistor 217B and the capacitor 219, and the gates of the P-type transistors 216 are connected to the node between the resistor 217B and the capacitor 219. Accordingly, the voltages of the gates of the P-type transistors 216 can be biased or fixed at the pre-determined voltage VDD by the BIAS element 213.

In another embodiment, portions 218 of the sources of the two P-type transistors 216 and/or the drain and the source of the N-type transistor 220 are lacking in silicide. Specifically, the Silicide Blocking Layer (SAB) is utilized in accordance with its relating mask and the manufacturing process to remove the silicide in certain portions 218 of the sources of the two P-type transistors 216 and/or the drain and the source of the N-type transistor 220. Therefore, the silicide layer of the portions 218 mentioned above will be removed, and the resistance of the specific portions 218 will increase for improving the capability of sustaining the high energy caused by the surge.

On the one hand, when the surge does not occur, the voltages of the sources of the two P-type transistors 216 are at a low level, which is lower than the pre-determined voltage VDD, and the P-type transistors 216 are turned-off. Accordingly, the enabling signal ES is not generated by the detection element 211, and the N-type transistor 220 of the protection unit 212 is turned-off. On the other hand, when the surge occurs, the high energy arises due to the surge and at least one of the voltages at the sources of the two P-type transistors 216 will increase and exceed the pre-determined voltage VDD. Since at least one of the voltages at the sources of the P-type transistors 216 is at a high level which is greater than the low level, at least one of the P-type transistors 216 is turned-on. Afterwards, the enabling signal ES is generated at the drains of the P-type transistors 216 and outputted to the protection element 212, and the buffer 215 is initiated or enabled to drive the protection element 212.

In this embodiment, the enabling signal ES is transmitted to the gate of the N-type transistor 220, and the voltage at the gate of the N-type transistor 220 is pulled to a high level for initiating or enabling the protection element 212. Accordingly, a discharge path is formed between the first terminal (the node TXP) and the second terminal (the node TXN) through the N-type transistor 220. The high energy generated by the surge can be bypassed or released through the discharging path, and the abrupt voltage variation can be reduced to protect the chip 200 and also the digital subscriber loop system. In other words, a large current induced by the surge at the first terminal or the second terminal is discharged or released by the discharging path. Therefore, when the surge or the ESD event is auto-detected by the detection element 211, the enabling signal ES is issued to the protection element 212 for developing a discharging path to alleviate the abrupt high energy and protect the IC. With the surge-protection circuit 210 of the present invention, the IC and the digital subscriber loop system 100 can be protected with lower cost, simplifier configuration and reduced layout size, while the additional and dedicated protection components mentioned in the related art may be eliminated.

Figure 4A:
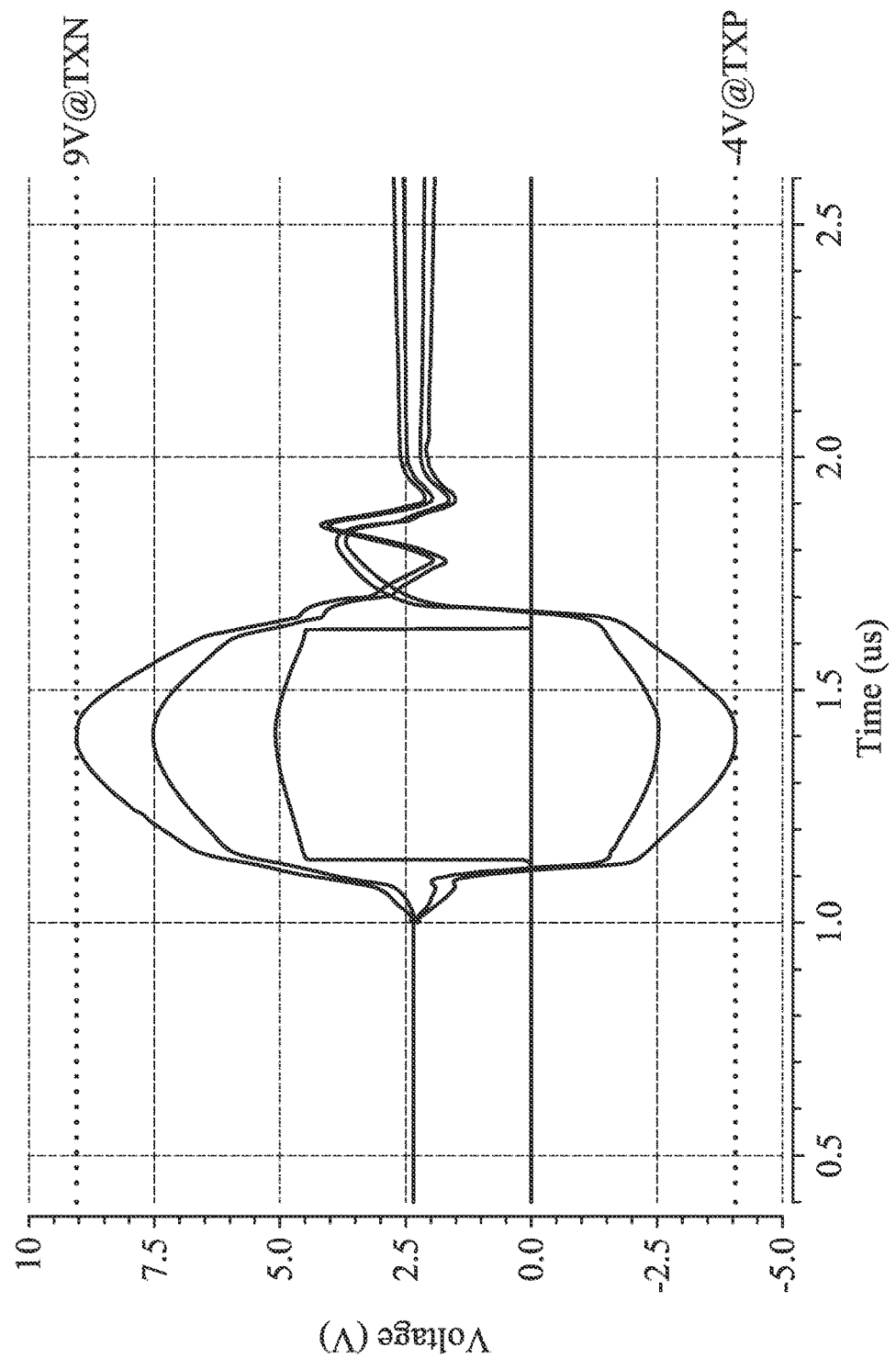
FIG. 4A is a schematic diagram illustrating voltages without the surge-protection circuit of the chip.
Figure 4B:
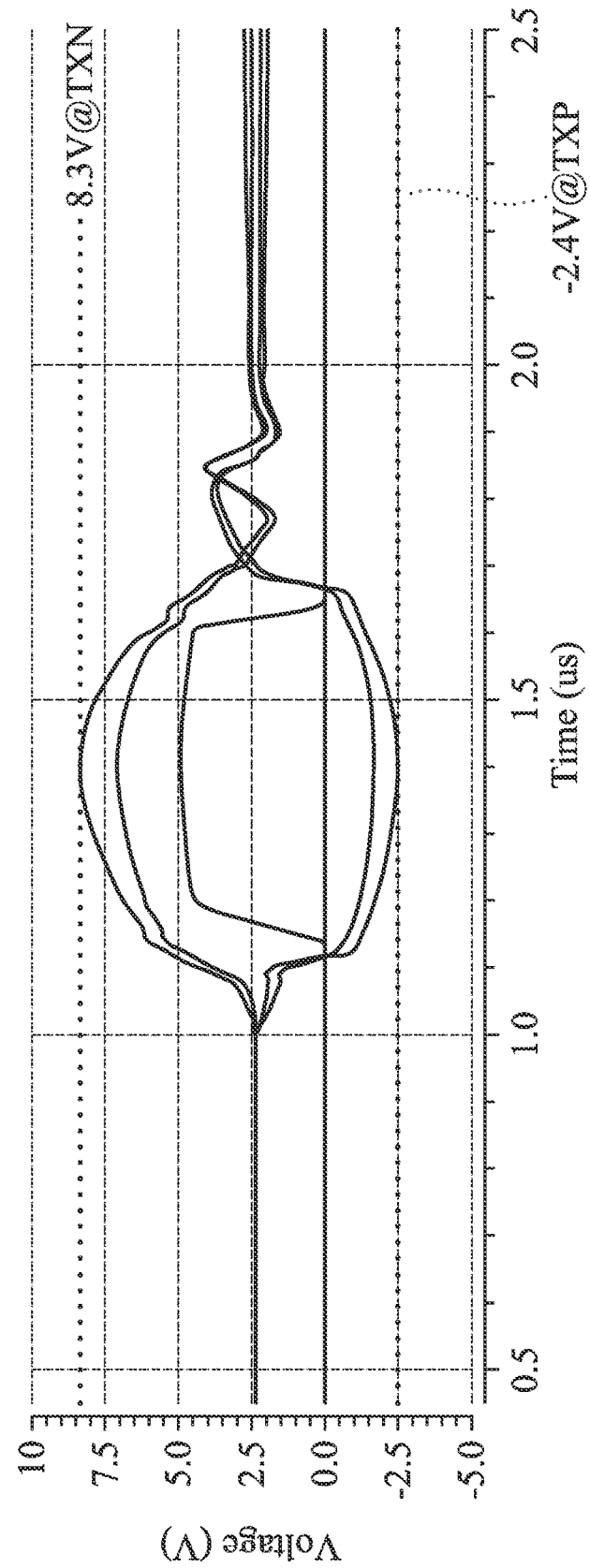
FIG. 4B is a schematic diagram illustrating voltages with the surge-protection circuit of the chip according to another embodiment of the present invention.
Figure 4C:
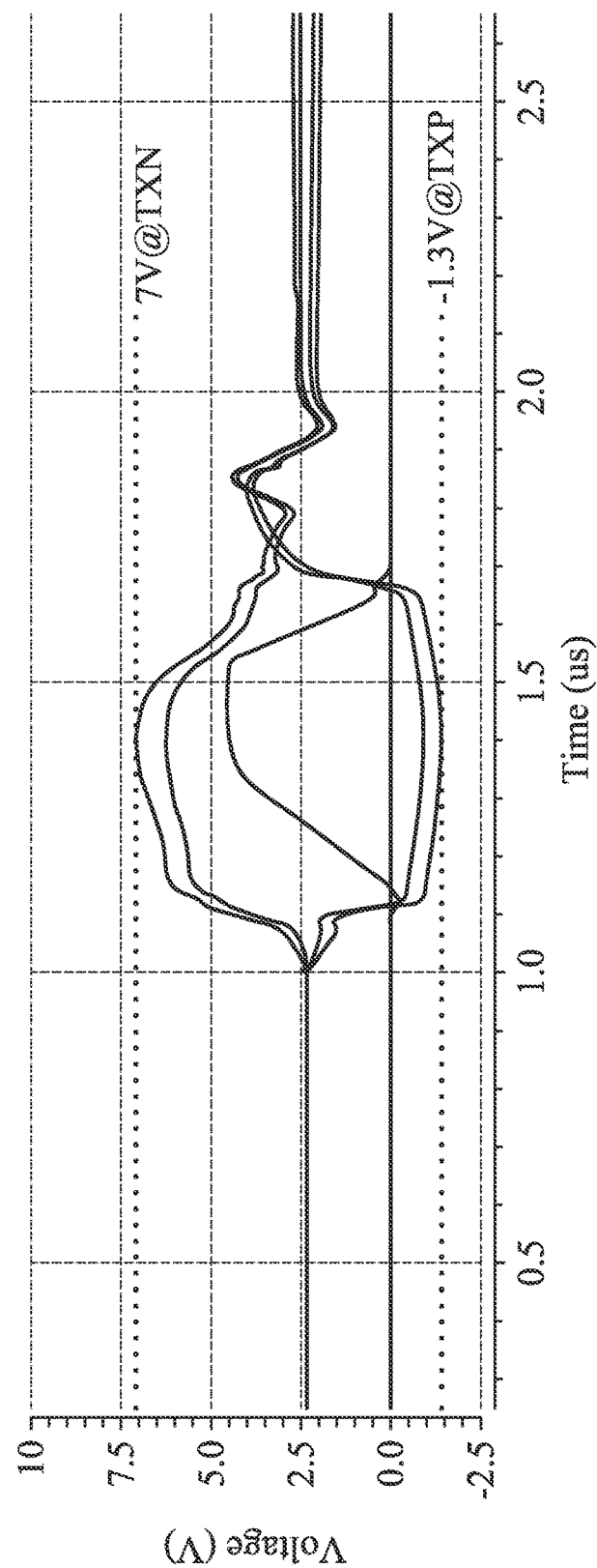
FIG. 4C is a schematic diagram illustrating voltages with the surge-protection circuit of the chip according to another embodiment of the present invention.

FIG. 4A is a schematic diagram illustrating voltages without the surge-protection circuit 210 of the chip 200. The abrupt variation or diversity occurs due to the surge as shown in FIG. 4A. Specifically, the highest voltage of the node TXN is about 9V, and the lowest voltage of the node TXP is about −4V. In addition, FIGS. 4B and 4C are schematic diagrams illustrating voltages with the surge-protection circuit 210 of the chip 200 according to another embodiment of the present invention. FIG. 4B illustrates that the highest voltage of the node TXN is about 8.3V and the lowest voltage of the node TXP is about −2.4V. The surge is detected and the discharging path is developed by the surge-protection circuit 210 of the present invention, therefore, the abrupt variation in voltages of the nodes TXN and TXP will be adjusted and reduced. In addition, FIG. 4C illustrates that the highest voltage of the node TXN is about 7V and the lowest voltage of the node TXP is about −1.3V, which means the abrupt variation in voltages of the nodes TXN and TXP has been further reduced by the large-size surge-protection circuit 210. Specifically, the size of the N-type transistor 220 of the embodiment of FIG. 4C is larger than that of FIG. 4B. The N-type transistor 220 with a larger size has a better performance sustaining and bypassing surges of large currents to protect the IC and the digital subscriber loop system.

Figure 5:
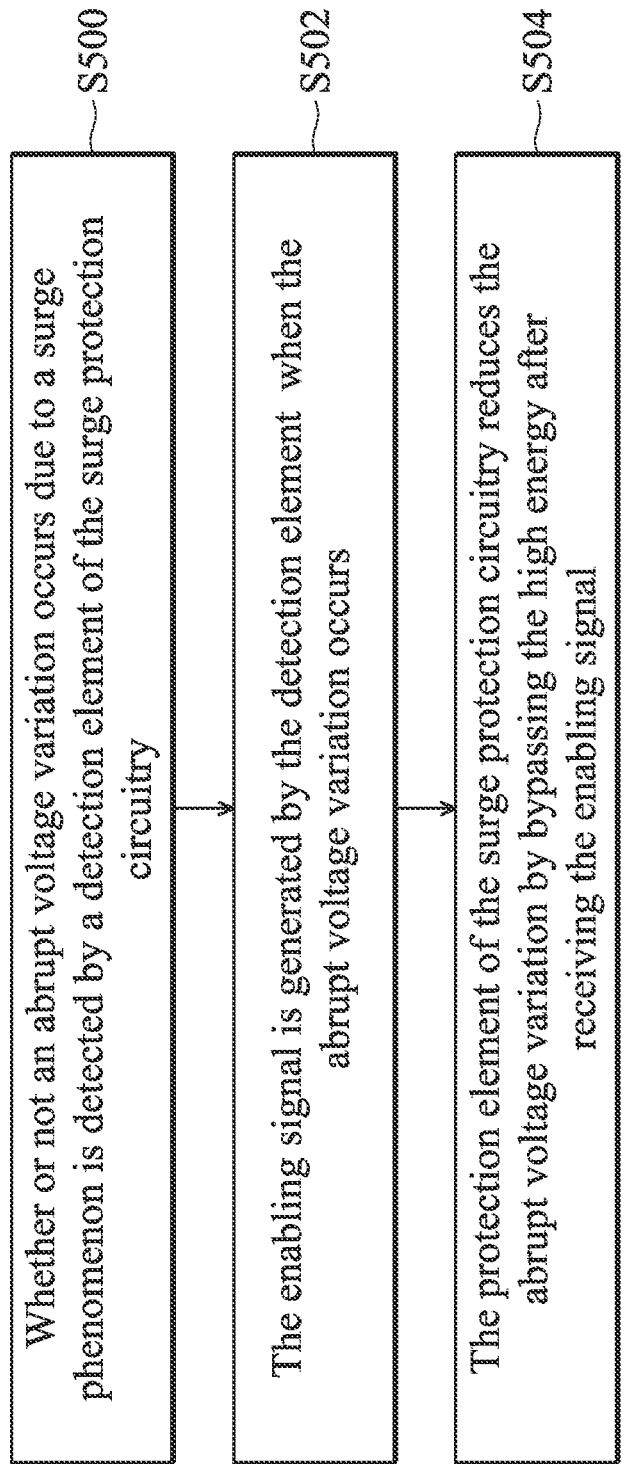
FIG. 5 is a flowchart of the surge-protection circuit of the chip according to one embodiment of the present invention.

FIG. 5 is a flowchart of the surge-protection circuit 210 of the chip 200 according to one embodiment of the present invention. In step S500, Whether an abrupt voltage variation occurs due to a surge or not is detected by a detection element 211 of the surge-protection circuit 210. Afterwards, in step S502, an enabling signal ES is generated by the detection element 211 when the abrupt voltage variation occurs. Afterwards, in step S504, a protection element 212 of the surge-protection circuit 210 reduces the abrupt voltage variation through bypassing the high energy after receiving the enabling signal SE. The detailed configuration of the surge-protection circuit 210 and the surge-protection method are illustrated above and will not be repeated again.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A surge-protection circuit for a chip, comprising:
   a detection element, embedded on the chip and arranged between a first terminal and a second terminal, utilized to detect whether or not an abrupt voltage variation occurs due to a surge and to generate an enabling signal when the abrupt voltage variation occurs, wherein the first terminal of the chip is a receiver input or transceiver output terminal for digital signal transmission, and the detection element further comprises a differential pair composed of two P type transistors; and
   a protection element, embedded on the chip and coupled to the detection element, utilized to adjust and reduce the abrupt voltage variation by bypassing high energy generated by the surge after receiving the enabling signal.

2. The surge-protection circuit as claimed in claim 1, wherein the first terminal and the second terminal are transmission outputs of the chip.

3. The surge-protection circuit as claimed in claim 1, wherein the first terminal and the second terminal are a receiving input and a ground of the chip.

4. The surge-protection circuit as claimed in claim 1, wherein sources of the two P-type transistors are coupled to the first terminal and the second terminal respectively, and drains of the two P-type transistors are coupled together, and gates of the two P-type transistors are biased to a pre-determined voltage, and when the abrupt voltage variation occurs a voltage of one of the sources exceeds the pre-determined voltage and the enabling signal is generated at the drains of the two P-type transistors.

5. The surge-protection circuit as claimed in claim 4, wherein the surge-protection circuit further comprises a BIAS element coupled to the detection element, and the BIAS element is utilized for biasing the pre-determined voltage at the gates of the two P-type transistors.

6. The surge-protection circuit as claimed in claim 4, wherein the detection element further comprises a buffer coupled to the drains of the two P-type transistors to drive the protection element.

7. The surge-protection circuit as claimed in claim 4, wherein the protection element comprises an N-type transistor, a gate of the N-type transistor is coupled to the drains of the two P-type transistors, a drain and a source of the N-type transistor are coupled to the first terminal and the second terminal, and after receiving the enabling signal the N-type transistor is turned on for bypassing the high energy of the surge from the first terminal or the second terminal.

8. The surge-protection circuit as claimed in claim 7, wherein portions of the sources of the two P-type transistors and/or the drain and the source of the N-type transistor are lacking in silicide.

9. The surge-protection circuit as claimed in claim 1, wherein the protection element is a silicon control rectifier (SCR) or a field oxide device (FOD), the trigger terminal of the protection element is coupled to the detection element, and an anode and a cathode of the protection element are coupled to the first terminal and the second terminal for bypassing the high energy of the surge from the first terminal or the second terminal.

10. A surge-protection circuit, comprising:
    a differential pair composed of two P-type transistors, and embedded on the chip, wherein sources of the two P-type transistors are coupled to a first terminal and a second terminal respectively, and drains of the two P-type transistors are coupled together, and gates of the two P-type transistors are biased to a pre-determined voltage, and when an abrupt voltage variation occurs a voltage of one of the sources exceeds the pre-determined voltage and an enabling signal is generated at the drains of the two P-type transistors; and
    an N-type transistor, embedded on the chip and coupled to the drains of the two P-type transistors, wherein a drain and a source of the N-type transistor are coupled to the first terminal and the second terminal, and after receiving the enabling signal the N-type transistor is turned on for bypassing the high energy of the surge from the first terminal or the second terminal.

11. The surge-protection circuit as claimed in claim 10, wherein portions of the sources of the two P-type transistors and/or the drain and the source of the N-type transistor are lacking in silicide.

12. The surge-protection circuit as claimed in claim 10, further comprising a BIAS element is coupled to the differential pair for biasing the pre-determined voltage at the gates of the two P-type transistors.

13. The surge-protection circuit as claimed in claim 12, further comprising a buffer is coupled between the gate of the N-type transistor and the drains of the two P-type transistors to drive the N-type transistor.

14. The surge-protection circuit as claimed in claim 10, wherein the first terminal and the second terminal are transmission outputs of the chip.

15. The surge-protection circuit as claimed in claim 10, wherein the first terminal and the second terminal are a receiving input and a ground of the chip.

16. A surge-protection method, utilized for a surge-protection circuit which is embedded on a chip, comprising:
    detecting whether an abrupt voltage variation occurs due to a surge or not by a detection element of the surge-protection circuit, wherein the detection element is arranged between a first terminal and a second terminal, and the first terminal of the chip is a receiver input or transceiver output terminal for digital signal transmission, and the detection element further comprises a differential pair composed of two P type transistors;
    generating an enabling signal by the detection element when the abrupt voltage variation occurs; and
    reducing the abrupt voltage variation through bypassing high energy generated by the surge after receiving the enabling signal by a protection element of the surge-protection circuit.

17. The surge-protection method as claimed in claim 16, wherein sources of the two P-type transistors are coupled to the first terminal and the second terminal respectively, gates of the two P-type transistors are biased to a pre-determined voltage, and when the abrupt voltage variation occurs a voltage of one of the sources exceeds the predetermined voltage and the enabling signal is generated at the drains of the two P-type transistors.

18. The surge-protection method as claimed in claim 17, wherein the protection element comprises a N-type transistor, a gate of the N-type transistor is coupled to the drains of the two P-type transistors, a drain and a source of the N-type transistor are coupled to the first terminal and the second terminal, and after receiving the enabling signal the N-type transistor is turned on to bypass the high energy of the surge from the first terminal or the second terminal.

* * * * *